United States Patent
McGarry et al.

(10) Patent No.: US 6,660,395 B2
(45) Date of Patent: Dec. 9, 2003

(54) SILICONE RESIN BASED COMPOSITES INTERLEAVED FOR IMPROVED TOUGHNESS

(75) Inventors: Frederick J. McGarry, Weston, MA (US); Bizhong Zhu, Midland, MI (US); Dimitris E. Katsoulis, Tokyo (JP)

(73) Assignee: Dow Corning Corporation, Midland, MI (US)

( * ) Notice: Subject to any disclaimer, the term of this patent is extended or adjusted under 35 U.S.C. 154(b) by 0 days.

(21) Appl. No.: 10/095,506

(22) Filed: Mar. 12, 2002

(65) Prior Publication Data

US 2003/0175533 A1 Sep. 18, 2003

(51) Int. Cl.[7] .................. B32B 9/04; B32B 27/12; B05D 3/02; B05D 1/02; B05D 1/36

(52) U.S. Cl. .............. 428/447; 428/448; 428/297.4; 427/402; 427/421; 427/387

(58) Field of Search ................. 428/447, 448, 428/297.4, 320.2; 427/421, 387, 402

(56) References Cited

U.S. PATENT DOCUMENTS

| | | | | |
|---|---|---|---|---|
| 4,842,670 A | * | 6/1989 | Callis et al. | 156/382 |
| 5,508,097 A | * | 4/1996 | Hauser et al. | 442/67 |
| 5,747,608 A | | 5/1998 | Katsoulis et al. | |
| 5,830,950 A | | 11/1998 | Katsoulis et al. | |
| 6,310,146 B1 | | 10/2001 | Katsoulis et al. | |

FOREIGN PATENT DOCUMENTS

EP 0522738 A1 1/1993

* cited by examiner

Primary Examiner—Robert Dawson
Assistant Examiner—Michael J Feely
(74) Attorney, Agent, or Firm—Clark Hill PLC

(57) ABSTRACT

Fiber reinforced silicone matrix resin based composites are made more resistant to delamination by incorporating a suitably tough, lower modulus silicone resin, different from said matrix resin, between each fiber layer of the composite. Preferably, woven mats of glass or carbon fibers impregnated with a desired silicone matrix resin are coated with a precursor of the tougher interleaf silicone resin. The resulting laminate of alternating matrix resin-fiber layers and interleaved layers of the tougher silicone resin provides a tougher silicone based composite.

11 Claims, No Drawings

SILICONE RESIN BASED COMPOSITES INTERLEAVED FOR IMPROVED TOUGHNESS

TECHNICAL FIELD

This invention pertains to silicone resin based composites. More specifically, this invention relates to fiber reinforced, resin composites having a rigid silicone matrix resin where the composite layers are interleaved with a thin silicone layer of compliant impact resistant material.

BACKGROUND OF THE INVENTION

Fiber reinforced, silicone matrix resin composites find many applications in structural components. The fiber reinforcement often takes the form of woven glass fiber mats. Woven carbon fiber mats offer a higher modulus reinforcing media but they are more expensive than glass fibers. Other fiber compositions such as aramid, nylon, polyester and quartz fibers may be used. Other fibrous forms, such as non-woven mats and layers of loose fibers, may also be used in silicone resin based composite applications.

A large family of silicone matrix resins are available for composite applications. Such resins are typically highly branched and cross-linked polymer molecules in cured form. They are substantially rigid materials displaying a high modulus of elasticity and high elastic shear modulus.

These fiber reinforced, silicone matrix resin composites in multi-layer laminated form are strong and fire resistant and find applications such as interiors for airplanes and ships. They are also used in electrical applications, such as wiring boards and printed circuit boards, requiring flexural strength and low weight.

Thus, laminated silicone resin composites have many uses. However, when they are stressed to failure, such composites tend to fail by delamination. The fracture occurs in the matrix resin between layers of reinforcing fibers. It would be desirable to devise a fiber reinforced, silicone composite more resistant to such a failure mode. Therefore, it is an object of this invention to provide an improved silicone resin based, laminated composite displaying higher toughness and impact resistance.

SUMMARY OF THE INVENTION

This invention improves the fabrication of rigid silicone matrix resin, fiber mat reinforced composites by incorporating a thin layer of tough compliant silicone resin at the laminar interfaces. As successive layers of matrix resin wetted fiber mats are laid up, a thin coating of a suitable mobile silicone resin, formulated for its toughness relative to the silicone matrix resin, is applied between the layers. Preferably, the mobile silicone resin is sprayed onto one side of each wetted fiber layer. The viscosity of the interleaved, or interfacial resin coating permits it to flow and conform to the surface details of the resin impregnated glass fiber mat, for example, and provide a substantially void-free layer between the laminations. Preferably, the interleaved silicone resin is formulated to cure during the curing of the matrix resin in the fabricated laminar structure.

Suitable silicone resin matrices of the composites are curable copolymers that are produced, for example, from a combination of traditional siloxane di-functional and tri-functional building blocks. These blocks include $PhSiO_{3/2}$, $MeSiO_{3/2}$, $PhMeSiO_{2/2}$, $Me_2SiO_{2/2}$, $ViMeSiO_{2/2}$, $HMeSiO_{2/2}$, $HPhSiO_{2/2}$, $ViSiO_{3/2}$, $ViMe_2SiO_{1/2}$, $O_{1/2}(Me_2)$ Si—R—Si(Me$_2$)O$_{1/2}$, and the like. Here Ph represents the phenyl group, Me represents the methyl group, Vi the vinyl group and R a divalent hydrocarbon, such as the phenylene group. An example of a suitable matrix resin for woven glass fiber mats is the silanol group containing $(PhSiO_{3/2})_{0.40}$ $(MeSiO_{3/2})_{0.45}(Ph_2SiO_{2/2})_{0.1}(PhMeSiO_{2/2})_{0.05}$. The content of trifunctional blocks is such that the matrix silicone resin is substantially rigid upon curing, typically having a Young's Modulus greater than or equal to 0.67 GPa. Other suitable polymer building blocks include silphenylenes, silmethylenes, silethylenes and the like. The silicone matrix resins may include modifiers such as linear or branched silicone segments that add desired physical property benefits to the matrix.

The fiber component of the composites will usually be glass or carbon because of favorable cost and availability, but other fiber reinforcing materials are suitable for many applications. For example, quartz fibers and aramid, nylon and polyester fibers may be used. Woven fiberglass mats are usually preferred for ordinary applications where cost is an important consideration. Non-woven fiber mats and loose fiber layers are suitable.

The silicone resin selected for the interleaf material is to be complementary in its properties to the matrix resin. It is more compliant than the generally rigid matrix resin. The interleaf resin may be synthesized from similar siloxane moieties but the resultant resin is to add toughness, resistance to delamination, and impact strength to the composite. Thus, the interleaf resin will typically contain a smaller portion of trifunctional siloxane groups than the matrix resin and will have a lower Young's modulus, preferably less than or equal to 0.3 GPa. An example of an interleaf silicone resin for use in combination with the above stated matrix resin is the methoxy functional $(PhSiO_{3/2})_{0.34}(Me_2SiO_{3/2})0.56$ $(MeSiO_{3/2})0.1$ resin. It is preferred that the interleaf resin be applied as a thin compliant film between prepreg laminates and cured simultaneously with the matrix resin.

In most applications, the thickness of a single layer of matrix resin wetted fiber mat is about three to one hundred fifty mils (about 75 to 3750 micrometers). The thickness of the interleaved resin is suitably much smaller, about 25 to 75 micrometers. In general, the thickness of the prepreg will be from three to fifty times the thickness of the interleaf resin layer. Thus, prior art silicone resin laminates comprise a predetermined number of stacked and molded layers of matrix resin impregnated fiber layers. But the laminates of this invention include a relatively thin coating of interleaved silicone resin between each layer of prepreg.

The mechanical properties of composites made with a suitable interleaf resin show higher toughness, without undue loss of strength and modulus, than the analogous composites fabricated without the interleaf silicone resin. Preferably, the interleaf resin causes no loss of heat stability or elevated temperature properties of the composites. The flexural modulus of composites made with and without the interleaf resin are comparable.

Other objects and advantages of the invention will become apparent from a detailed description of preferred examples that follow.

DESCRIPTION OF A PREFERRED EMBODIMENT

The practice of this invention includes the selection of a suitable silicone matrix resin, a suitable complementary silicone interleaf resin and fibrous reinforcement.

The fibrous reinforcing material is, of course, essential for the composite structure but it is not necessarily a critical part of use of the invention. Woven mats of glass fibers or carbon fibers impart good strength to composites and the woven structures are easy to impregnate with the matrix resin precursor and coat with the interleaf resin precursor. Other forms and fiber compositions may be used without changing the basic strategy of the invention.

The selection of the silicone matrix resin is largely based on known considerations for achieving compatibility with the specified reinforcing fibers and the desired properties of the composite. However, the interleaf silicone resin is chosen for its compatibility with the matrix resin and the requirement that the interleaf resin toughen the composite. Typically each fiber reinforcement layer will be wetted and infiltrated with the matrix resin in a relatively low molecular weight uncured state. This precursor resin material will be suitably formulated so that it is curable by application of heat and pressure to laid up prepreg sheets. Similarly, the precursor form of the interleaf resin will preferably be applied by spraying or other coating step to at least one side of the prepreg strips. Accordingly, it is preferred that both the matrix resin and the tougher interleaf resin be cured at the same time.

As disclosed above, both the matrix resin and interleaf resin will likely contain siloxane groups or blocks like $PhSiO_{3/2}$, $MeSiO_{3/2}$, $PhMeSiO_{2/2}$, $Me_2SiO_{2/2}$, $ViMeSiO_{2/2}$, $HMeSiO_{2/2}$, $HPhSiO_{2/2}$, $ViSiO_{3/2}ViMe_2SiO_{1/2}$, and $O_{1/2}(Me_2)Si-R-Si(Me_2)O_{1/2}$. The uncured form of the resin may contain silanol groups or alkoxy groups so as to be curable by a condensation process. Or the precursor resins may contain functional groups that permit curing by a hydrosilylation reaction Included among the latter group of suitable silicone matrix resins are the silsesquioxane resins described in U.S. Pat. No. 6,310,146, Katsoulis, et al, entitled Silsesquioxane Resin With High Strength and Fracture Toughness and Method for the Preparation Thereof. The specification of the '146 patent is incorporated into this specification for a full description of these useful silicone resins.

As taught in the '146 patent the base silsesquioxane resin is a hydrosilylation reaction curable copolymer resin. It comprises units that have the empirical formula $R^1_a R^2_b R^3_c SiO_{(4-a-b-c)/2}$, where a is zero or a positive number, b is zero or a positive number, and c is zero or a positive number, providing that $0.8 \leq (a+b+c) \leq 3.0$. Further, each copolymer has at least two $R^1$ groups per molecule, and each $R^1$ is a functional group independently selected from the group consisting of hydrogen atoms and monovalent hydrocarbon groups having aliphatic unsaturation. Each $R^2$ and $R^3$ are monovalent hydrocarbon groups independently selected from the group consisting of nonfunctional groups and $R^1$.

Preferably, $R^1$ is an alkenyl group such as vinyl or allyl. Typically, $R^2$ and $R^3$ are nonfunctional groups selected from the group consisting of alkyl and aryl groups. Suitable alkyl groups include methyl, ethyl, isopropyl, n-butyl and isobutyl groups. The phenyl group is a typical aryl group. In addition to the other silsesquioxane copolymers identified in this specification, another suitable silsesquioxane copolymer is $(PhSiO_{3/2})_{0.75}(ViMe_2SiO_{1/2})_{0.25}$.

The practice of the invention is further illustrated by the following examples.

EXAMPLE 1

Preparation of a Glass Fabric Reinforced Silicone Resin Laminate

In this example, a glass fabric reinforced silicone resin laminate was prepared as a basis for comparison with an interleaved composite prepared in accordance with this invention.

A solid, low molecular weight silicone resin with reactive silanol groups (approx. 2 wt %) was used as the matrix resin. A commercial glass fiber fabric with a woven style of 7781 and a heat cleaned surface (finish type 112) was used as the reinforcement to make the laminate. The silicone resin had a number average molecular weight of approx. 1400 and a weight average molecular weight of approx. 1800. It was curable by condensation of the residual silanol groups. The composition of the fully condensed resin would be represented as $(PhSiO_{3/2})_{0.4}(MeSiO_{3/2})_{0.45}(Ph_2SiO_{2/2})_{0.1}(PhMeSiO_{2/2})_{0.05}$.

114 g of the above characterized uncured resin was dissolved in 96 g of toluene. The following curing materials were added to the resin solution: 0.144 g of Dow Corning Catalyst Y-177® (a commercially available material comprising zinc octoate and choline octoate), 7.2 g triethoxysiloxy terminated polydimethylsiloxane of degree of polymerization 14, and 1.11 g of dibutyl tin dilaurate.

127 g of glass fabric, cut into 8 square pieces 9"×9" in size, were impregnated with the resin solution. The impregnated fabric pieces were put on top of a metal mesh in a ventilating hood overnight to evaporate the toluene. Then the weight of the dried, resin impregnated fabric pieces was recorded and these pieces were stacked up in a 0/180° orientation (top to top, bottom to bottom) to eight plies. The stacked, eight layer, fabric-resin composite was then sandwiched between two Teflon coated flat aluminum plates and cured in a heated press. The temperature and pressure cycles were as follows. The temperature of the press was increased at a rate of 5° F./min. from room temperature to 350° F. The temperature was held at 180° F. for 7 minutes with minimum pressure. Then a pressure of 45 psi was applied. The temperature was held at 350° F. for one hour. The pressure was maintained at 45 psig. The press was then water cooled at a rate of 5° F./min. to 100° F. while maintaining the pressure at 45 psig.

The cured laminate was taken out of the press and put into an air circulating oven to post cure at 400° F., or higher up to 500° F., for one hour. The oven was switched off and the laminate was allowed to cool in the oven to room temperature.

The laminate was then weighed and the resin content was determined to be about 40 wt %.

Several samples were prepared in the same way and the yield strain, flexural strength, flexural modulus and impact energy determined in accordance with the test procedures described below. The average values for the respective tests are in the row titled Example 1 of the following table.

EXAMPLE 2

Preparation of Silicone Rubber Interleaved, Glass Fabric Reinforced Silicone Resin Laminate In this example a glass fiber reinforced silicone resin composite is prepared interleaved with a tough silicone resin in accordance with this invention.

The resin composition specified in Example 1 was used as the matrix resin. The same glass fiber fabric with a woven style of 7781 and a finish type 112 was used as the reinforcement material. 114 g of the uncured resin was dissolved in 96 g of toluene. As in Example 1, 0.144 g of Dow Corning Catalyst Y-177®, 7.2 g triethoxysiloxy terminated polydimethylsiloxane of degree of polymerization 14, and 1.11 g of dibutyl tin dilaurate were added into the solution and mixed thoroughly.

As in Example 1, 127 g of glass fabric, cut into 8 square pieces 9"×9" in size, were impregnated with the resin solution. The impregnated fabric pieces were put on top of a metal mesh in a ventilating hood to dry overnight. Then the weight of the dried, resin impregnated fabric pieces was recorded.

An approximately 2 mil thick coating of Dow Corning 1-2577 conformal, silicone resin coating was applied to one side of the impregnated fabric by spraying a 10 wt. % solution of the conformal coating onto the surface. The solvent for diluting the conformal coating was toluene. The coating was a methoxy functional $(PhSiO_{3/2})_{0.34}(Me_2SiO_{2/2})_{0.56}(MeSiO_{3/2})_{0.1}$ resin. The spray coated, impregnated fabric was left to dry for another 12 hours. These pieces were weighed again and stacked up in a 0–180° orientation to eight plies. The stacked fabric-resin composite was then sandwiched in between two Teflon coated flat aluminum plates and cured in a heated press.

The temperature and pressure cycle of the press operation were the same as in Example 1 and as follows. The temperature in the press was raised at a rate of 5° F./min. from room temperature to 350° F. The temperature was held at 350° F. for 7 minutes with minimum pressure. Then a pressure of 45 psi applied. The temperature was hen held at 350° F. for one hour. The press was water cooled at a rate of 5° F./min. to 100° F. while maintaining the pressure of 45 psig.

The cured interleaved laminate was taken out of the press and put into an air circulating oven to post cure at about 400° F. for one hour. Then the oven was switched off and the laminate was allowed to cool in the oven to room temperature.

The laminate was then weighed and the resin content was determined to be about 40 wt %.

Several samples were prepared in the same way. The interleaf coating was applied by spraying. The coatings were quite thin but the experimental spray procedure would not necessarily produce uniform interleaf layer thicknesses. The yield strain, flexural strength, flexural modulus and impact energy of each of the samples were determined in accordance with the test procedures described below. The average values for the yield strain and flexural tests are in the row titled Example 2 of the following table. However, because of the variation in thickness of the different thin interleaf coatings the range of impact energies obtained are reported in the table. It is seen that all of the impact energy values for the interleaf layer specimens were substantially larger than the impact energy values for the prior art, Example 1 specimens. Some of the interleaf samples had nearly twice the impact energy values of the Example 1 samples.

Flexural Testing

Testing was done per ASTM 790 using an Instron Loadframe 8520, and a 100 lb. load cell. The crosshead rate was 4 mm/min. The specimen dimensions are 1"×4" and eight plies thick. A span of 50 mm was used. The specimens were cut from the laminates using a water cooled diamond saw and dried at 80° C. and conditioned under testing conditions for at least 24 hours before testing. From this test Young's modulus, flexural strength, and flexural strain were obtained. Toughness was obtained as the energy absorption per unit volume of the sample before break.

Impact Testing

Testing was done per ASTM 3029 using a Test Method G Impact Tester. Specimens of 2"×2" in size were cut using a water cooled diamond saw, dried under conditions described in the above paragraphs and conditioned the same way before testing. Impact Energy was determined as the energy level to give rise to a statistically recognizable failure.

Comparison:

| Sample | Wt. % Glass | Yield Strain % | Flexural Strength, ksi | Flexural Modulus, ksi | Impact Energy, in.lb |
|---|---|---|---|---|---|
| Example 1 | 60 | 1.70 ± 0.42 | 24.66 ± 0.22 | 1835 ± 142 | 23.5 ± 0.7 |
| Example 2 | 60 | 1.72 ± 0.36 | 16.50 ± 0.60 | 1487 ± 73 | 26.0–46.0 |

Thus, the invention was illustrated using woven glass fiber mats but other suitable fiber compositions and forms may be used in the practice of the invention. Examples are given in the background section of this specification. Similarly other rigid silicone matrix resins and compliant silicone interleaf resins can be used.

Accordingly, while the invention has been described by some illustrative examples, it is apparent that other forms could readily be adapted buy one skilled in the art. Accordingly, the scope of the invention is to be limited only by the following claims.

What is claimed is:

1. A fiber reinforced, silicone matrix resin composite comprising: a plurality of layers of fibers, each layer of fibers being impregnated with said silicone matrix resin, wherein said silicone matrix is a rigid resin; and a layer of silicone resin interleaved between each of said impregnated fiber layers, wherein the silicone resin has a lower modulus of elasticity and higher toughness than said matrix resin.

2. A fiber reinforced, silicone matrix resin composite as recited in claim 1 in which the Young's modulus of said silicone matrix resin is equal to or greater than 0.67 GPa and the Young's modulus of said interleaved silicone resin is less than or equal to 0.3 GPa.

3. A fiber reinforced composite as recited in claim 1 in which said layers of fibers comprise woven mats of fibers of a material selected from the group consisting of aramid resins, polyester resins, nylon resins, carbon, glass or quartz.

4. A fiber reinforced composite as recited in claim 1 in which said silicone matrix resin comprises siloxane moieties selected from the group consisting of $PhSiO_{3/2}$, $MeSiO_{3/2}$, $PhMeSiO_{2/2}$, $Me_2SiO_{2/2}$, $ViMeSiO_{2/2}$, $HMeSiO_{2/2}$, $HPhSiO_{2/2}$, $ViSiO_{3/2}$, $ViMe_2SiO_{1/2}$, and $O_{1/2}(Me_2)Si—R—Si(Me_2)O_{1/2}$, where Ph represents the phenyl group, Me the methyl group, Vi the vinyl group and R a divalent hydrocarbon.

5. A fiber reinforced composite as recited in claims 1 in which said silicone matrix resin prior to curing comprises silanol group containing $(PhSiO_{3/2})_{0.40}(MeSiO_{3/2})_{0.45}(Ph_2SiO_{2/2})_{0.1}(PhMeSiO_{2/2})_{0.05}$.

6. A fiber reinforced composite as recited in claims 1 in which said interleaved silicone resin comprises siloxane moieties selected from the group consisting of $PhSiO_{3/2}$, $MeSiO_{3/2}$, $PhMeSiO_{2/2}$, $Me_2SiO_{2/2}$, $ViMeSiO_{2/2}$, $HMeSiO_{2/2}$, $HPhSiO_{2/2}$, $ViSiO_{3/2}$, $ViMe_2SiO_{1/2}$, and $O_{1/2}(Me_2)Si—R—Si(Me_2)O_{1/2}$, where Ph represents the phenyl group, Me the methyl group, Vi the vinyl group and R a divalent hydrocarbon.

7. A fiber reinforced composite as recited in claim 1 in which said interleaved silicone resin prior to curing comprises methoxy functional $(PhSiO_{3/2})_{0.34}(Me_2SiO_{2/2})_{0.56}(MeSiO_{3/2})_{0.1}$ resin.

8. A fiber reinforced composite as recited in claim 1 in which said interleaved silicon resin layer was formed by spraying a precursor of said resin onto a surface of each of said layers of silicone matrix resin impregnated fibers and then simultaneously curing said interleaved silicone resin and said silicone matrix resin.

9. A method of making a fiber reinforced, silicone matrix resin composite, said method comprising impregnating at least one layer of reinforcing fibers with a curable silicone matrix resin to form a plurality of matrix resin coated fiber layers, said silicone matrix resin being substantially rigid upon curing;

spraying a layer of a curable silicone resin as a substantially coextensive compliant coating, thinner than said matrix resin coated fiber layer, on one side of each of said matrix resin coated fiber layers, said sprayed silicone resin upon curing having a lower Young's modulus than said cured silicone matrix resin;

stacking a plurality of said spray coated, matrix resin coated fiber layers and molding said layers while curing said resins to form said silicone matrix resin composite with interleaved layers of said lower modulus silicone resin.

10. A method as recited in claim 9 in which the Young's modulus of said silicone matrix resin is equal to or greater than 0.67 GPa and the Young's modulus of said interleaved silicone resin is less than or equal to 0.3 GPa.

11. A method as recited in claim 9 in which said interleaved silicone resin comprises siloxane moieties selected from the group consisting of $PhSiO_{3/2}$, $MeSiO_{3/2}$, $PhMeSiO_{2/2}$, $Me_2SiO_{2/2}$, $ViMeSiO_{2/2}$, $HMeSiO_{2/2}$, $HPhSiO_{2/2}$, $ViSiO_{3/2}$, $ViMe_2SiO_{1/2}$, and $O_{1/2}(Me_2)Si$—R—$Si(Me_2)O_{1/2}$, where Ph represents the phenyl group, Me the methyl group, Vi the vinyl group and R a divalent hydrocarbon.

* * * * *

UNITED STATES PATENT AND TRADEMARK OFFICE
CERTIFICATE OF CORRECTION

PATENT NO.    : 6,660,395 B2
DATED         : December 9, 2003
INVENTOR(S)   : Frederick J. McGarry et al.

It is certified that error appears in the above-identified patent and that said Letters Patent is hereby corrected as shown below:

Column 6,
Lines 50 and 54, delete "claims" and insert -- claim -- therefor.

Signed and Sealed this

Fourth Day of May, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,660,395 B2
DATED : December 9, 2003
INVENTOR(S) : Frederick J. McGarry et al.

It is certified that error appears in the above-identified patent and that said Letters Patent is hereby corrected as shown below:

<u>Title page,</u>
Item [73], Assignee, add -- Massachusetts Institute of Technology, Cambridge, MA (US) --

Signed and Sealed this

Sixth Day of July, 2004

JON W. DUDAS
*Acting Director of the United States Patent and Trademark Office*